United States Patent
Hsieh et al.

(10) Patent No.: US 10,263,139 B2
(45) Date of Patent: Apr. 16, 2019

(54) FABRICATION METHOD OF NITRIDE LIGHT EMITTING DIODES

(71) Applicant: XIAMEN SANAN OPTOELECTRONICS TECHNOLOGY CO., LTD., Xiamen (CN)

(72) Inventors: Hsiang-lin Hsieh, Xiamen (CN); Zhibo Xu, Xiamen (CN); Cheng-hung Lee, Xiamen (CN); Chan-chan Ling, Xiamen (CN); Chang-cheng Chuo, Xiamen (CN); Chia-hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 77 days.

(21) Appl. No.: 15/401,091

(22) Filed: Jan. 8, 2017

(65) Prior Publication Data
US 2017/0117436 A1 Apr. 27, 2017

Related U.S. Application Data

(63) Continuation of application No. PCT/CN2015/073465, filed on Mar. 2, 2015, and a
(Continued)

(30) Foreign Application Priority Data

Jul. 24, 2014 (CN) .......................... 2014 1 0354965
Oct. 17, 2014 (CN) .......................... 2014 1 0549383

(51) Int. Cl.
*H01L 21/02* (2006.01)
*H01L 33/00* (2010.01)
*H01L 33/12* (2010.01)

(52) U.S. Cl.
CPC ............ *H01L 33/007* (2013.01); *H01L 33/12* (2013.01)

(58) Field of Classification Search
CPC ..... H01L 33/12; H01L 21/02; H01L 21/0237; H01L 21/02458; H01L 21/02439;
(Continued)

(56) References Cited

U.S. PATENT DOCUMENTS

2006/0175628 A1 8/2006 Otsuka et al.
2011/0089436 A1 4/2011 Jeong
(Continued)

FOREIGN PATENT DOCUMENTS

| CN | 1799123 A | 7/2006 |
|---|---|---|
| CN | 102364706 A | 2/2012 |
| CN | 103956418 A | 7/2014 |

*Primary Examiner* — Chuong A Luu
(74) *Attorney, Agent, or Firm* — Syncoda LLC; Feng Ma

(57) ABSTRACT

A fabrication method of a nitride semiconductor LED includes, an $Al_xIn_yGa_{1-x-y}N$ material layer is deposited by CVD between an AlN thin film layer by PVD and a gallium nitride series layer by CVD, to reduce the stress effect between the AlN thin film layer and the nitride layer, improve the overall quality of the LED and efficiency. An AlN thin film layer is deposited on a patterned substrate having a larger depth by PVD, and a thin nitrogen epitaxial layer is deposited on the AlN thin film layer by CVD, which reduces the stress by reducing the thickness of the epitaxial layer and improves warpage of the wafer and electric uniformity of the single wafer; the light extraction efficiency is improved by using the large depth patterned substrate; further, the doping of high-concentration impurity in the active layer effectively reduces voltage characteristics without affecting leakage, thereby improving the overall yield.

13 Claims, 7 Drawing Sheets

Related U.S. Application Data continuation of application No. PCT/CN2015/078638, filed on May 11, 2015.

(58) Field of Classification Search
CPC ......... H01L 21/02502; H01L 21/02631; H01L 21/02661; H01L 21/0254; H01L 33/00; H01L 33/06; H01L 33/32; H01L 33/007
USPC .......................................................... 438/47
See application file for complete search history.

(56) References Cited

U.S. PATENT DOCUMENTS

2012/0001220 A1* 1/2012 Hiraiwa ................ H01L 33/145
 257/98
2013/0285065 A1 10/2013 Zhu

* cited by examiner

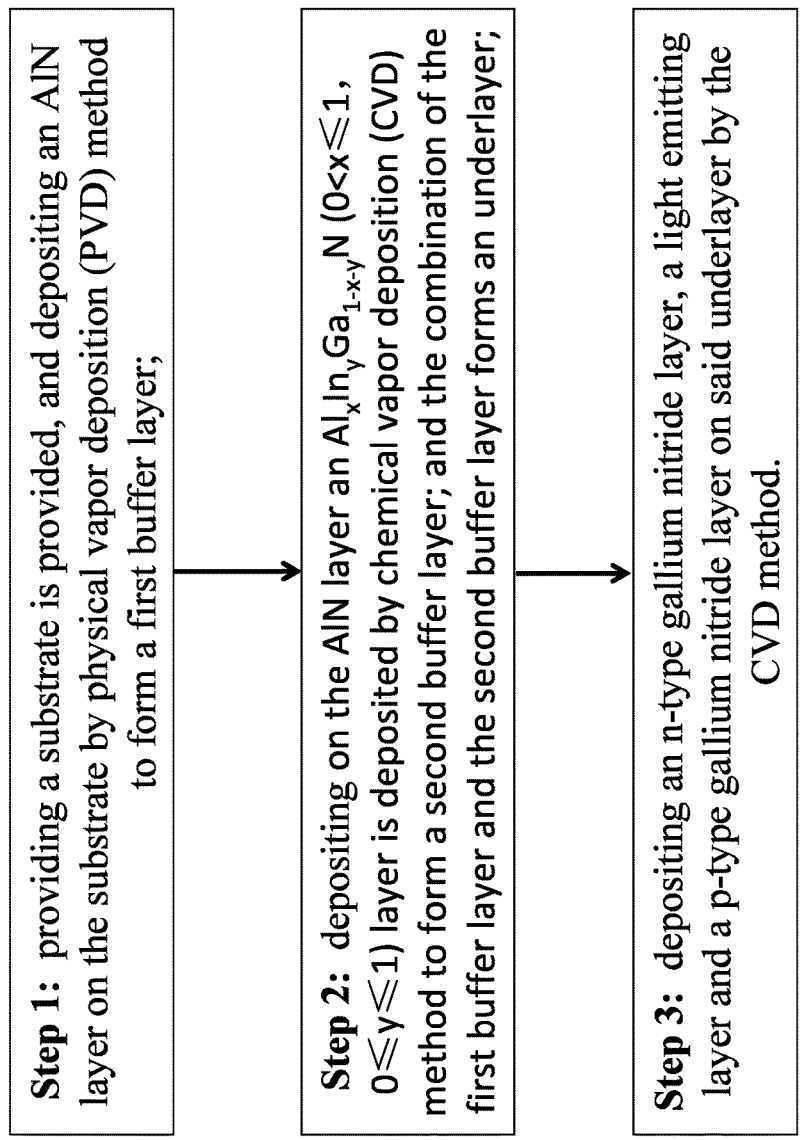

Step 1: providing a substrate is provided, and depositing an AlN layer on the substrate by physical vapor deposition (PVD) method to form a first buffer layer;

Step 2: depositing on the AlN layer an $Al_xIn_yGa_{1-x-y}N$ ($0<x\leq1$, $0\leq y\leq1$) layer is deposited by chemical vapor deposition (CVD) method to form a second buffer layer; and the combination of the first buffer layer and the second buffer layer forms an underlayer;

Step 3: depositing an n-type gallium nitride layer, a light emitting layer and a p-type gallium nitride layer on said underlayer by the CVD method.

FIG. 3 ly to improve the light extraction efficiency. However, for epitaxially growing the LED material on the patterned substrate surface by the present conventional metal organic chemical vapor deposition (MOCVD), the depth of the pattern on the patterned substrate surface is required to be less than 2 μm, and if the
FABRICATION METHOD OF NITRIDE LIGHT EMITTING DIODES

CROSS-REFERENCE TO RELATED APPLICATIONS

The present application is a continuation of, and claims priority to, PCT/CN2015/073465 filed on Mar. 2, 2015, which in turn claims priority to Chinese Patent Application No. 201410354965.0 filed on Jul. 24, 2014; and PCT/CN2015/078638 filed on May 11, 2015, which in turn claims priority to Chinese Patent Application No. 201410549383.8 filed on Oct. 17, 2014. The disclosures of these applications are hereby incorporated by reference in their entirety.

BACKGROUND

Physical vapor deposition (PVD) refers to a technology that under a vacuum condition, material source—the solid or liquid surface—is gasified into gaseous atoms or molecules, or part of them is ionized into ions, and then through the low-pressure gas (or plasma) process, a special-purpose film is deposited on the substrate surface. The physical vapor deposition method mainly includes vacuum vapor deposition, sputtering coating, arc plasma plating, ion plating, molecular beam epitaxy and the like; the method is applied not only in the deposition of metal film, alloy film, but also the deposition of compound film, ceramic film, semiconductor film, polymer film and the like; the technology process is simple, has less pollution on the environment, and saves raw materials, and produces even and dense film with strong adhesion to the substrate.

In view of the above advantages of the PVD method, and with the rapid development of the light emitting diode (LED) research, the method is widely applied in the fabrication of light emitting diodes. U.S. Patent Application Pub. No. 2013/0285065 discloses that the AlN thin film layer formed by the PVD method is flat and its roughness is less than 1 nm; that the lattice quality is good and the 002 peak width at half height is less than 200; and that on the thin film layer an n-type layer, a light emitting layer and a p-type layer and the like nitride layers are deposited by chemical vapor deposition (CVD). In the actual fabrication, the deposition of the crystal layer by the chemical vapor deposition method is greatly different from the PVD method in terms of the growth chamber environment, and the crystal layer is composed of the GaN system, and has large lattice mismatch with the AlN thin film layer, resulting in large stress between the AlN thin film layer by the PVD method and the nitride layer by the CVD method, which easily leads to poor quality of light emitting diode and low luminous efficiency.

Further, with the application of the patterned substrate technique, a pattern having a fine structure is fabricated on the planar substrate surface, and then the LED material epitaxially grows on the patterned substrate surface. The patterned interface changes the growth process of the GaN material, and restrains the defects from extending to the epitaxy surface and improves the efficiency of the quantum in the device; at the same time, the roughened GaN/substrate interface diffuses the photons emitted from the active region, so that the originally full-emitted photons have the opportunity to exit from the device so to effectively improve the light extraction efficiency. However, for epitaxially growing the LED material on the patterned substrate surface by the present conventional metal organic chemical vapor deposition (MOCVD), the depth of the pattern on the patterned substrate surface is required to be less than 2 μm, and if the depth is larger than this value, the MOCVD method cannot result in a quality epitaxial film layer; in addition, due to the characteristics of uneven surface of the patterned substrate, a thick buffer layer should be laminated in the n-type layer and the substrate in the LED structure, causing the epitaxial layer surface before the growth of the n-type layer to achieve the required smooth structure so to be conducive to the subsequent lamination of epitaxial layers; yet the thick underlayer structure produces a greater stress, resulting in a greater warping of the LED structure upon the completion of the growth, which is not conducive to the follow-up process implementation (such as splinter incurred in follow-up process) and leads to obvious difference of electric properties in different locations in a single LED structure and further the impact on the growth yield rate; further the doping concentration of the active layer is also limited due to the impact of the quality of the underlayer, therefore higher doping level cannot be obtained, thus limiting the further improvement of the voltage isoelectricity.

SUMMARY

To solve the above problem, and according to the first aspect of the present disclosure, a fabrication method of nitride semiconductor is provided, wherein, an $Al_xIn_yGa_{1-x-y}N$ material layer by CVD method is deposited between a PVD AlN thin film layer and a CVD nitride layer, the $Al_xIn_yGa_{1-x-y}N$ material layer can help reduce the stress effect between the AlN thin film layer and the nitride layer, improve the overall quality of the light emitting diode and finally improve the luminous efficiency.

According to some embodiments disclosed herein, a fabrication method of nitride light emitting diode includes the following steps: step 1: providing a substrate, and depositing an AlN layer on the substrate by physical vapor deposition (PVD) method to form a first buffer layer; step 2: depositing on the AlN layer an $Al_xIn_yGa_{1-x-y}N$ ($0<x\leq1$, $0\leq y\leq1$) layer by chemical vapor deposition (CVD) method to form a second buffer layer; and combining the first buffer layer and the second buffer layer to form an underlayer; step 3: depositing an n-type gallium nitride layer, a light emitting layer and a p-type gallium nitride layer on the nitride underlayer by the CVD method.

The second buffer layer composed of $Al_xIn_yGa_{1-x-y}N$ material and formed by the CVD method and the first buffer layer composed of AlN material are both of an aluminum contained material layer, therefore the two buffer layers have similar material coefficients and the lattice mismatch between the two buffer layers is low; further, due to the deposition method of the second buffer layer is the same as that of the deposited layer in step 3, preferably metal-organic chemical vapor deposition (MOCVD) method can be chosen, thereby reducing the stress between the materials in step 1 and step 3, and improving the quality of the lattice layer of the underlying layer and of the overall epitaxial structure.

In some embodiments, the thickness of the first buffer layer formed ranges from 5 Å to 350 Å.

In some embodiments, the thickness of the second buffer layer formed ranges from 5 Å to 1500 Å.

In some embodiments, the growth temperature of the second buffer layer formed ranges from 400° C. to 1150° C.

In some embodiments, the n-type gallium nitride layer formed in step 3 is an n-type doped gallium nitride layer or a combined layer of an undoped gallium nitride layer and the n-type gallium nitride layer.

In some embodiments, the underlayer formed is undoped or doped with n-type or p-type impurity.

In some embodiments, the n-type impurity is silicon or tin.

In some embodiments, the p-type impurity is zinc, magnesium, calcium or barium.

In some embodiments, the concentration of the n-type or p-type impurity ranges from $10^{17}/cm^3$ to $10^{20}/cm^3$.

In some embodiments, the first buffer layer is formed by depositing in a PVD chamber; the second buffer layer is formed by depositing in an MOCVD chamber.

In the above method, the second buffer layer composed of $Al_xIn_yGa_{1-x-y}N$ material and formed by the CVD method has a low lattice mismatch with the first buffer layer composed of the AlN material, and the deposition chamber environment of the second buffer layer is the same as the growth environment of the deposition layer in step 3, and accordingly, the method can reduce the stress between the materials in step 1 and step 3 and the quality of the whole epitaxial structure can be improved.

According to the second aspect of the present disclosure, a fabrication method of nitride semiconductor is provided, wherein, an AlN thin film layer is deposited on a patterned substrate having a larger depth by the PVD method and a thin nitrogen epitaxial layer is deposited on the AlN thin film layer by the CVD method, which reduces the stress by reducing the thickness of the epitaxial layer and so improves the warpage of the epitaxial wafer and further the electric uniformity of the single wafer; at the same time, the light extraction efficiency is improved by using the large depth patterned substrate; further, the doping of high-concentration impurity in the active layer effectively reduces the voltage characteristics while not affecting the leakage, thereby improving the overall yield of light emitting diodes.

According to some embodiments, a fabrication method of nitride light emitting diode includes the following steps: step 1: providing and placing a substrate in the physical vapor deposition (PVD) chamber; step 2: depositing an AlN material layer on the substrate by the PVD method; step 3: taking out the substrate deposited with the AlN material layer and then placing the substrate in a carrier and transferring the carrier to the chemical vapor deposition (CVD) chamber; step 4: depositing a nitride material layer on the surface of the AlN material layer by the CVD method; step 5: depositing a highly doped active layer on the surface of the nitride material layer; the doping concentration should be as high as sufficient to improve the voltage characteristics of the light emitting diode; step 6: depositing a p-type layer on the surface of the active layer with high-concentration doped impurity.

In some embodiments, the deposition method used in step 3 through step 6 is the metal-organic chemical vapor deposition (MOCVD) method.

In some embodiments, the substrate is a patterned substrate with the height of pattern of 2-20 µm.

In some embodiments, the pattern on the substrate is prepared by dry etching or wet etching or the combination of the two etching methods.

In some embodiments, the nitride material layer in step 4 is a combined layer of an undoped gallium nitride material layer and the n-type gallium nitride material layer.

In some embodiments, the nitride material layer in step 4 is a combined layer of a low-temperature gallium nitride layer, a high-temperature undoped gallium nitride layer and the n-type gallium nitride material layer.

In some embodiments, the growth temperature of the low-temperature gallium nitride layer ranges from 200° C. to 900° C.

In some embodiments, the thickness of the nitride material layer in step 4 ranges from 1.0 µm to 3.5 µm.

In some embodiments, the thickness of the whole epitaxial layer of the nitride light emitting diode is less or equal to 4 µm.

In some embodiments, the high doped active layer deposited in step 6 is doped with n-type impurity, with a doping concentration higher than $6 \times 10^{18}/cm^3$.

In some embodiments, the temperature of the chamber in step 2 is 350-550° C.

In some embodiments, the pressure of the chamber in step 2 is 2-10 mtorr.

In some embodiments, the thickness of the AlN material layer deposited in step 2 is 5-350 Å.

In the above method, the AlN thin film layer with flat surface is deposited on the patterned substrate having a larger depth by the PVD method and the thin nitrogen epitaxial layer structure is deposited on the AlN thin film layer by the CVD method, and in the structure, the active layer is doped with high-concentration n-type impurity; the large depth patterned substrate improves the light extraction efficiency, and the thinner epitaxial layer reduces the stress, thus improving the warpage of the epitaxial wafer and further the electric uniformity of the single wafer; at the same time, the high-concentration doped active layer improves the voltage characteristics of the light emitting diode structure and further improves the overall yield of light emitting diode chip.

BRIEF DESCRIPTION OF THE DRAWINGS

The drawings are provided to facilitate a further understanding of the invention and are incorporated in and constitute a part of the specifications, and together with the embodiments of the invention, are used for interpreting the invention but not intending to limit the invention. In addition, the figures in the drawings are descriptive and not drawn to scale.

FIG. 3 is the flow diagram of the fabrication method of a nitride semiconductor of Embodiment 1 of the present disclosure.

DETAILED DESCRIPTION

The embodiments of the present disclosure are described in details below with reference to the drawings.

Embodiment 1

Figure 1:
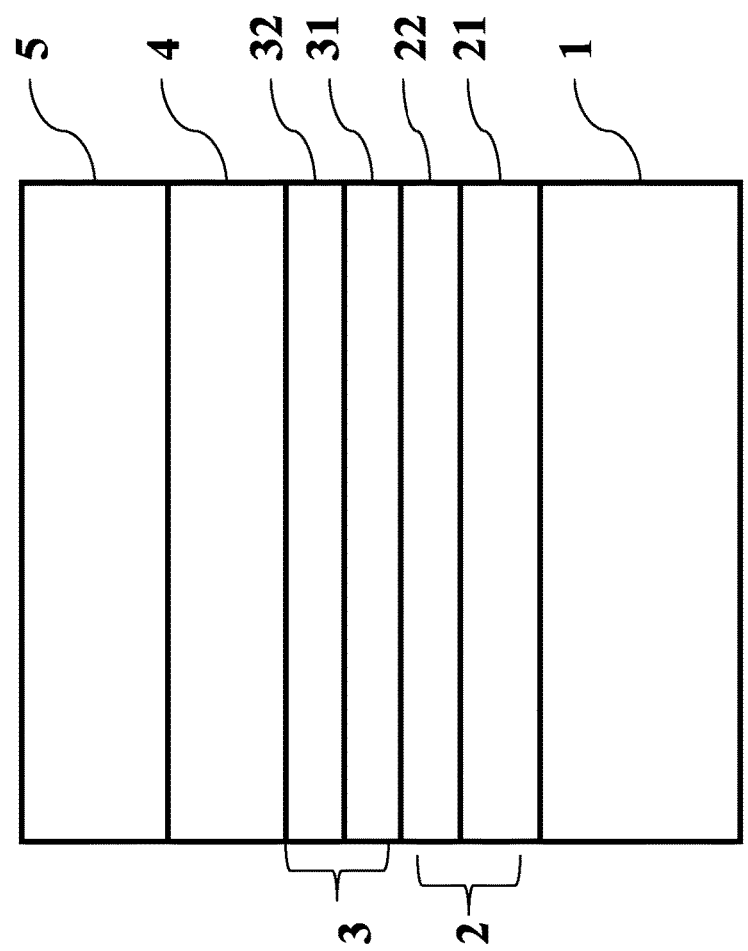
FIG. 1 is a schematic diagram of a light emitting diode structure according to some embodiments.
Figure 2:
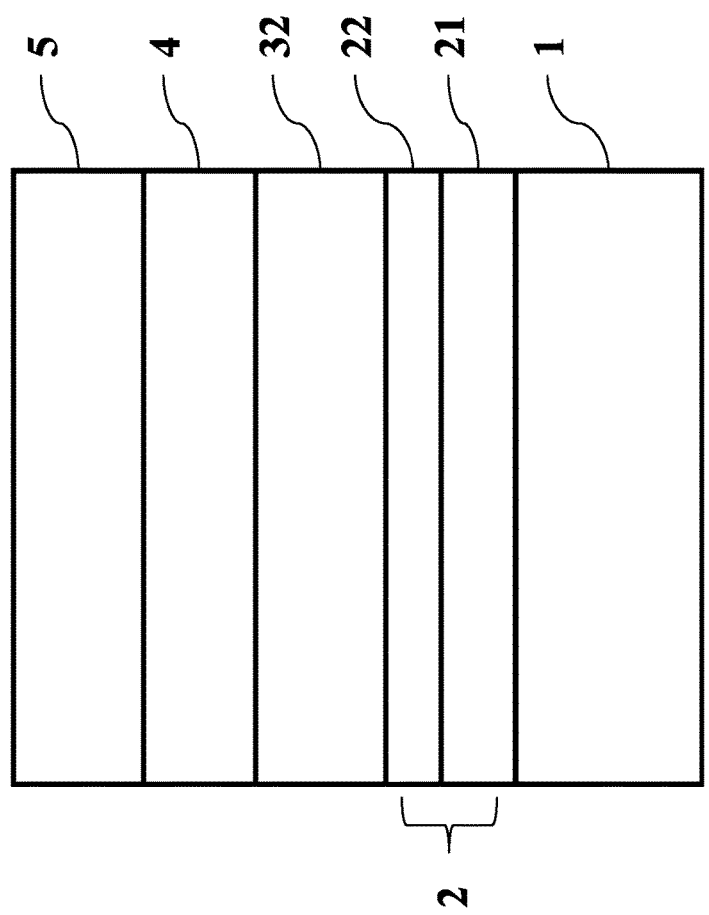
FIG. 2 is a schematic diagram of a light emitting diode structure according to Embodiment 1.

As shown in FIGS. 1-3, a fabrication method of nitride semiconductor, comprising the following steps:

Step 1: providing a substrate 1 which can be a sapphire substrate or a silicon substrate or a patterned substrate, and placing the substrate in the physical vapor deposition (PVD)

chamber, and then depositing an AlN layer with thickness of 5 Å-350 Å on the substrate 1 by the PVD method to form the first buffer layer 21;

Step 2: placing the substrate on which the first buffer layer 21 is deposited in the chemical vapor deposition (CVD) chamber, and depositing an $Al_xIn_yGa_{1-x-y}N$ ($0<x\le1$, $0\le y\le1$) layer with a thickness of 5 Å-1500 Å by the CVD method, and then adjusting the composition of Al to have the lattice constant between that of the AlN layer and the gallium nitride series layer; and the $Al_xIn_yGa_{1-x-y}N$ ($0<x\le1$, $0\le y\le1$) layer is the second buffer layer 22 with growth temperature of 400-1150° C.; combining the second buffer layer 22 with the first buffer layer 21 to form the underlayer 2;

Step 3: adjusting the growth parameters such as temperature and gas flow in the CVD chamber in step 2, and then depositing an n-type gallium nitride layer 3, a light emitting layer 4 and a p-type gallium nitride layer 5 by the CVD method on the underlayer 2, wherein, the n-type gallium nitride layer 3 is a combined layer of the undoped gallium nitride layer 31 and the n-type doped gallium nitride layer 32 in turn; in addition, the n-type gallium nitride layer 3 may also be an n-type doped gallium nitride layer 32 (as shown in FIG. 2).

In the present embodiment, if the n-type gallium nitride layer 3, the light emitting layer 4 and the p-type nitride layer 5 are deposited in the CVD chamber directly in step 3 after the first buffer layer is deposited by the PVD method, the crystal state of deposited thin film is quite different since the depositional environments of the PVD chamber and the CVD chamber are different, and the lattice coefficients of the AN layer material and the subsequent nitride layer material are greatly different, which easily leads to the formation of a certain stress between the underlayer 2 and the subsequent gallium nitrogen series layer 3 and further affects the overall quality and performance of the light emitting diodes. However, when the second buffer layer 22 composed of $Al_xIn_yGa_{1-x-y}N$ material is inserted, since the difference between the lattice coefficients of the $Al_xIn_yGa_{1-x-y}N$ material and the material of the AlN layer and the gallium nitride layer decreases and the lattice matching degree increases, and that the second buffer layer 22 and the subsequent layers are deposited in the CVD chamber, so with low difference in terms of the deposition mode, the stress between the n-type gallium nitride layer 3 and the subsequent layers and the AlN layer is decreased and the overall crystal quality is improved.

Embodiment 2

The difference between Embodiment 2 and Embodiment 1 is that: the first buffer layer and the second buffer layer contained in the underlayer 2 are doped with n-type impurity, preferably silicon impurity, with a doping concentration of around $10^{17}$-$10^{20}$/cm$^3$.

Embodiment 3

The difference between Embodiment 3 and Embodiment 1 is that: the first buffer layer and the second buffer layer contained in the underlayer 2 are doped with p-type impurity, preferably magnesium impurity, with a doping concentration of around $10^{17}$-$10^{20}$/cm$^3$.

Embodiment 4

Figure 4:
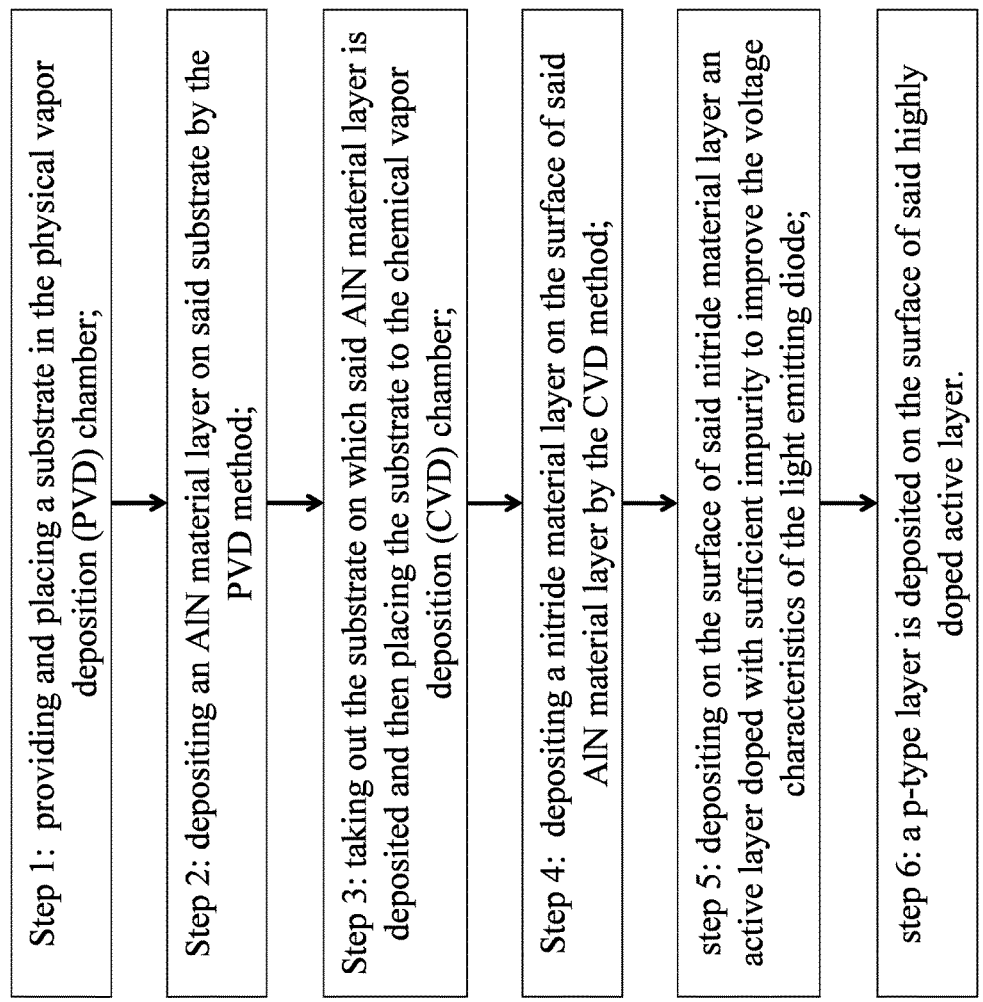
FIG. 4 is the flow diagram of the fabrication method of a nitride light emitting diode of Embodiment 4 of the present disclosure.
Figure 5:
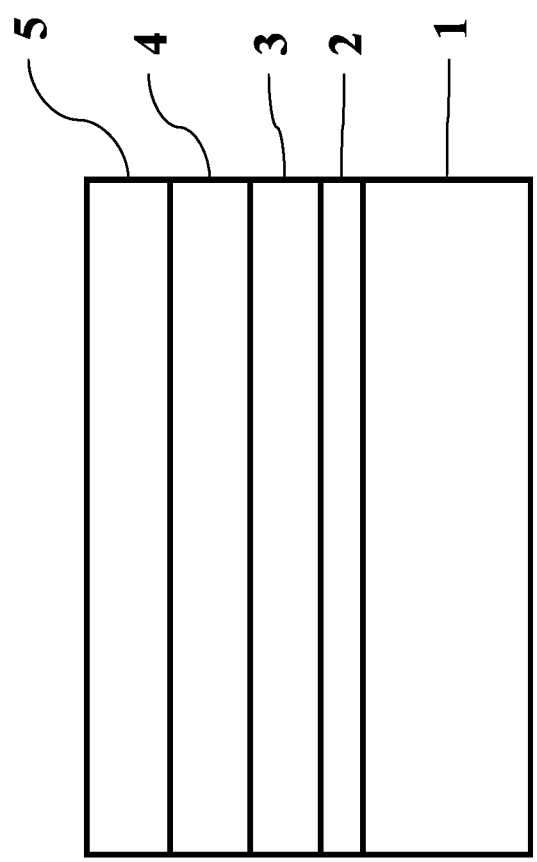
FIG. 5 is schematic diagram of the light emitting diode structures of Embodiment 4 of the present disclosure.

As shown in FIGS. 4 and 5, a substrate 1, which is a flat substrate or a patterned substrate and is composed of sapphire, silicon, silicon carbide, gallium nitride, gallium arsenide or the like, is provided, wherein, the vertical height of the pattern in the patterned substrate is 2-20 μm, and the pattern can be formed by dry etching or wet etching; the large depth substrate 1 is provided in the PVD chamber, the chamber temperature is adjusted to 350-550° C., the pressure 2-10 mtorr, and then an AlN material layer 2 with flat surface and a thickness of 5 to 350 Å is deposited by the PVD method on the surface of the substrate 1 by the PVD method; due to the film forming characteristics of the PVD method, even when the depth of the pattern on the patterned substrate is higher than that of the conventional substrate, the AlN material layer 2 can still maintain the characteristics of flat surface and high film quality; subsequently, the substrate on which the AlN material layer 2 is deposited is taken out, placed in a carrier and then transferred into the chemical vapor deposition (CVD) chamber, the temperature of the chamber is adjusted to 400-1150° C., and then a nitride material layer 3 is deposited by the CVD method on the surface of the AlN material layer 2; further a highly doped active layer 4 and a p-type layer 5 are deposited on the nitride material layer 3, the highly doped active layer 4 is doped with an n-type impurity, with a doping concentration of greater than $6\times10^{18}$/cm$^3$, sufficient to improve the voltage characteristics of the light emitting diode; the deposition mode of the nitride material layer 3 through the p-type layer 5 is preferably the metal organic chemical vapor deposition (MOCVD). The light emitting diode in such structure has a good crystal quality and little effect on the quality of the subsequently deposited material layer since that the AlN material layer is plated by the PVD method, therefore, the subsequent active layer can be doped with high-concentration impurities without significantly reducing the crystal quality, thus avoiding the electricity worsening such as the increase of leakage current, on the other hand, the high-concentration doped active layer structure can effectively reduce the voltage of the light emitting diode and improve the yield of the light emitting diode chip.

Embodiment 5

Figure 6:
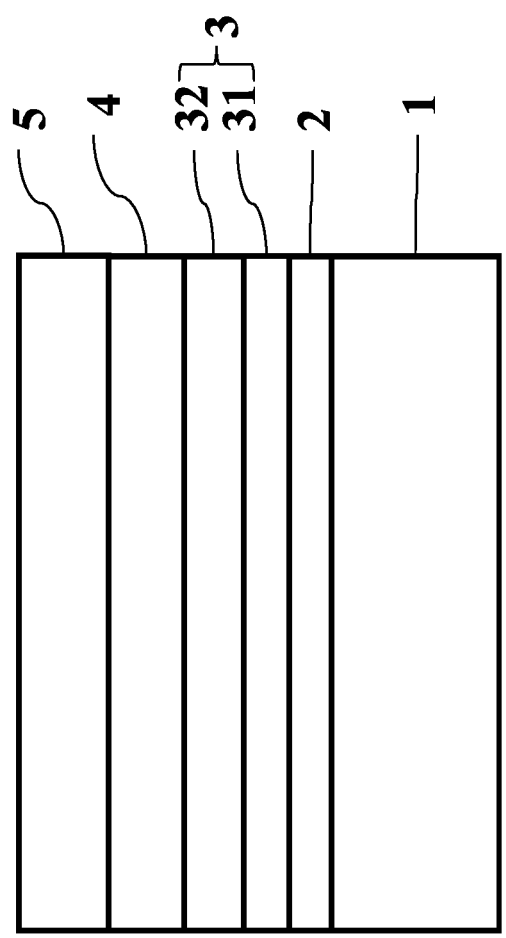
FIG. 6 is schematic diagram of the light emitting diode structures of Embodiment 5 of the present disclosure.

As shown in FIG. 6, a substrate 1, which is a flat substrate or a patterned substrate and is composed of sapphire, silicon, silicon carbide, gallium nitride, gallium arsenide or the like, is provided, wherein, if the patterned substrate is selected, the vertical height of the pattern is 2-20 μm, and the pattern can be formed by dry etching or wet etching; the large depth substrate 1 is provided in the PVD chamber, the chamber temperature is adjusted to 350-550° C., the pressure 2-10 mtorr, and then an AlN material layer 2 with flat surface and a thickness of 5 to 350 Å is deposited by the PVD method on the surface of the substrate 1 by the PVD method; due to the film forming characteristics of the PVD method, even when the depth of the pattern on the patterned substrate is higher than that of the conventional substrate, the AlN material layer 2 can still maintain the characteristics of flat surface and high film quality; subsequently, the substrate on which the AlN material layer 2 is deposited is taken out, placed in a carrier and then transferred into the chemical vapor deposition (CVD) chamber, the temperature of the chamber is adjusted to 900-1150° C., and then a nitride material layer 3 is deposited by the CVD method on the surface of the AlN material layer 2, and the layer is formed by combining a high-temperature undoped gallium nitride material layer 31 and an n-type gallium nitride material layer 32, wherein, the thickness of the undoped gallium nitride material layer 31 is 0-1.5 μm; that of the n-type gallium nitride material layer 32 is 1.0-3.0 µm; and that of the nitride material layer is 1.0-3.5 µm; further a doped active layer 4 and a p-type layer 5 are deposited on the nitride material layer 3, the former having a doping concentration sufficient to improve the voltage characteristics of the light emitting diode; further, the deposition mode of the nitride material layer 3 through the p-type layer 5 is preferably the metal organic chemical vapor deposition (MOCVD); the thickness of the whole epitaxial layer of the light emitting diode is less than or equal to 4 µm; the light emitting diode in such structure due to thinner underlayer and general lower thickness has decreased lattice stress, thus decreasing the warpage of the epitaxial wafer, and keep consistent growth condition and electrical property for the whole signal epitaxial wafer, and the probability of the splinters incurred in the subsequent process; meanwhile, the large depth of the substrate used in the structure can effectively improve the light extraction efficiency and further improve the growth yield of the light emitting diode.

Embodiment 6

Figure 7:
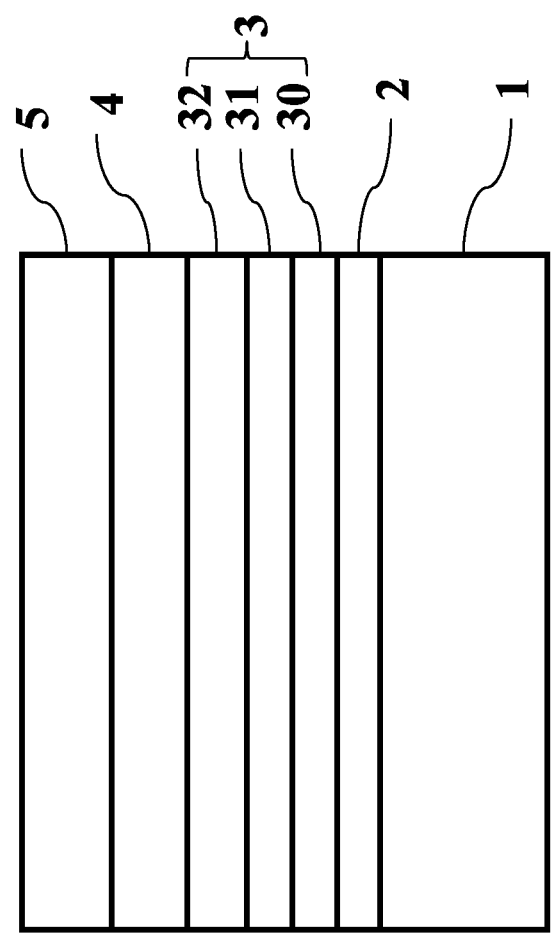
FIG. 7 is schematic diagram of the light emitting diode structures of Embodiment 6 of the present disclosure.

As shown in FIG. 7, the present embodiment is optimized on the basis of Embodiment 5, that is, when the substrate on which the AlN material layer 2 is deposited is taken out and placed in a chemical vapor deposition (CVD) chamber, the temperature of the chamber is adjusted to 200-900° C., then a low-temperature gallium nitride layer 30 is first deposited on the surface of the AlN material layer 2 by the CVD method, with a thickness of 5 Å-1500 Å, and next the chamber temperature is further increased to 900° C. or more, and a high-temperature undoped gallium nitride layer 31 is deposited, followed by the deposition of the n-type gallium nitride layer 32, and then the chamber temperature is adjusted properly before the deposition of the doped active layer 4 and the p-type layer 5.

In this embodiment, the low-temperature gallium nitride layer 30 is first deposited on the AlN material layer, and then before the high-temperature undoped gallium nitride layer is deposited after a temperature rise, is subjected to an elevated temperature annealing treatment so to have the low-temperature gallium nitride layer 30 to form an "island-like structure" and realize the "nucleation" process; since low-temperature gallium nitride layer 30 is grown at a low temperature, part of its crystal characteristics is similar to that of the AlN material layer 2, and part of the material properties is close to the subsequent nitride material layer 3, the layer can well connect the AlN material layer and the high temperature gallium nitride material layer, serve as a buffer to reduce the lattice stress between the AlN material layer 2 and the nitride material layer 3 and further improve the lattice quality of the subsequent epitaxial layer.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a nitride light emitting diode, the method comprising:
    step 1: providing and placing a substrate in a physical vapor deposition (PVD) chamber;
    step 2: depositing an AlN material layer over the substrate by PVD;
    step 3: moving the substrate, over which the AlN material layer is deposited, to a chemical vapor deposition (CVD) chamber;
    step 4: depositing a nitride material layer over a surface of the AlN material layer by CVD;
    step 5: depositing over a surface of the nitride material layer a highly-doped active layer with sufficient impurity to improve a voltage characteristics of the light emitting diode; and
    step 6: depositing a p-type layer over a surface of the highly-doped active layer.

2. The method of claim 1, wherein: said depositing in step 4 through step 6 is a metal-organic chemical vapor deposition (MOCVD).

3. The method of claim 1, wherein: the substrate is a patterned substrate with a height of pattern of 2-20 µm.

4. The method of claim 1, wherein: the highly-doped active layer deposited in step 5 is doped with n-type impurity, with a doping concentration higher than $6\times10^{18}/cm^3$.

5. The method of claim 1, wherein: the nitride material layer in step 4 is a combined layer of a high-temperature undoped gallium nitride layer and an n-type gallium nitride material layer.

6. The method of claim 1, wherein: the nitride material layer in step 4 is a combined layer of a low-temperature gallium nitride layer, a high-temperature undoped gallium nitride layer and an n-type gallium nitride material layer.

7. The method of claim 6, wherein: a growth temperature of the low-temperature gallium nitride layer ranges from 200° C. to 900° C.

8. The method of claim 6, wherein: a thickness of said low-temperature gallium nitride layer is 5 Å-1500 Å.

9. The method of claim 6, wherein: a thickness of the nitride material layer ranges from 1.0 µm to 3.5 µm.

10. The method of claim 1, wherein: a thickness of a complete epitaxial layer of the nitride light emitting diode is less than or equal to 4 µm.

11. The method of claim 1, wherein: a temperature of the chamber in step 2 is 350-550° C.

12. The method of claim 1, wherein: a pressure of the chamber in step 2 is 2-10 mtorr.

13. The method of claim 1, wherein: a thickness of the AlN material layer deposited in step 2 is 5-350 Å.

* * * * *